(12) United States Patent
Harano

(10) Patent No.: US 10,168,361 B2
(45) Date of Patent: Jan. 1, 2019

(54) CURRENT SENSOR AND MEASURING APPARATUS

(71) Applicant: HIOKI DENKI KABUSHIKI KAISHA, Nagano (JP)

(72) Inventor: Masayuki Harano, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 0 days.

(21) Appl. No.: 15/531,162

(22) PCT Filed: Dec. 15, 2015

(86) PCT No.: PCT/JP2015/084998
§ 371 (c)(1),
(2) Date: May 26, 2017

(87) PCT Pub. No.: WO2016/098751
PCT Pub. Date: Jun. 23, 2016

(65) Prior Publication Data
US 2017/0343585 A1 Nov. 30, 2017

(30) Foreign Application Priority Data
Dec. 18, 2014 (JP) .................................. 2014-256118

(51) Int. Cl.
*G01R 15/18* (2006.01)
*G01R 19/00* (2006.01)
(Continued)

(52) U.S. Cl.
CPC ........... *G01R 15/18* (2013.01); *G01R 15/183* (2013.01); *G01R 15/20* (2013.01); *G01R 19/0092* (2013.01); *G01R 15/146* (2013.01)

(58) Field of Classification Search
CPC ................ G01R 19/00; G01R 19/0084; G01R 19/0092; G01R 15/00; G01R 15/12;
(Continued)

(56) References Cited

U.S. PATENT DOCUMENTS 3,675,126 A * 7/1972 Chilton ..................... G01P 3/46
324/168
4,382,230 A * 5/1983 Gauthier ................... G01P 3/46
324/207.15
(Continued)

FOREIGN PATENT DOCUMENTS

| JP | 07-260830 | 10/1995 |
| JP | 10-185962 | 7/1998 |
| JP | 11-505677 | 5/1999 |

OTHER PUBLICATIONS

International Search Report, dated Feb. 9, 2016 by the Japan Patent Office, in the corresponding International Application No. PCT/JP2015/084998.

*Primary Examiner* — Hoai-An D. Nguyen
(74) *Attorney, Agent, or Firm* — Greenblum & Bernstein, P.L.C.

(57) ABSTRACT

A signal is outputted via a transmission path with little attenuation while eliminating high-frequency noise. A current sensor includes: a coil wound around a magnetic core through whose interior a measured electrical path is inserted, is connected to ground at one end, and outputs a current with a current value in keeping with a current value of a measured current flowing on the measured electrical path; a constant impedance filter whose input terminal is connected to another end of the coil, limits a frequency range of the current inputted from the input terminal to a desired frequency range, and outputs the detection current from an output terminal; a transmission path that is directly connected at one end to the output terminal; and a terminating (Continued)

resistance that is connected between another end of the transmission path and ground and converts the current flowing via the transmission path to a detection voltage.

2 Claims, 3 Drawing Sheets

(51) Int. Cl.
  *G01R 15/20* (2006.01)
  *G01R 15/14* (2006.01)
(58) Field of Classification Search
  CPC .... G01R 15/14; G01R 15/144; G01R 15/146;
  G01R 15/18; G01R 21/00; G01R 21/06;
  G01R 27/00; G01R 27/02; G01R 27/08;
  G01R 31/00; G01R 31/08; G01R 15/183;
  G01R 15/20
  USPC ......... 324/76.11, 76.39, 177, 222, 522, 713;
  702/1, 57, 64
  See application file for complete search history.

(56) References Cited

U.S. PATENT DOCUMENTS

| | | | | |
|---|---|---|---|---|
| 5,632,093 | A | * | 5/1997 | Elias ................ A61B 5/1111 33/366.25 |
| 5,659,273 | A | | 8/1997 | Harpham |
| 6,608,536 | B2 | * | 8/2003 | Fallahi ................ H03H 7/06 333/133 |

* cited by examiner

F I G. 1
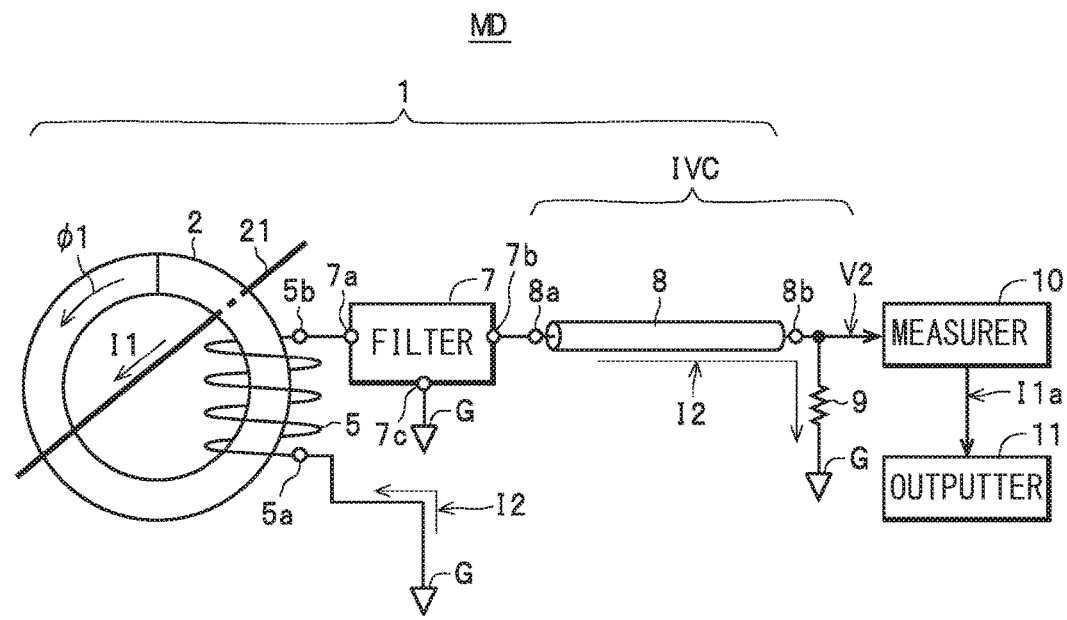
F I G. 2
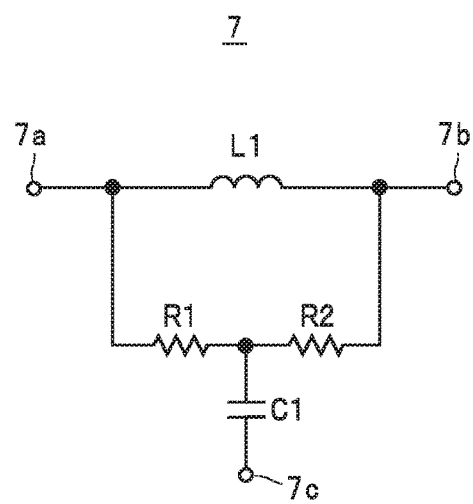

CURRENT SENSOR AND MEASURING APPARATUS

TECHNICAL FIELD

The present invention relates to a current sensor that includes a coil wound around a magnetic core and detects a measured current that flows in a measured object that has been inserted through an interior of the magnetic core, and also relates to a measuring apparatus equipped with this current sensor.

BACKGROUND ART

A current sensor (or "current detecting apparatus") disclosed in Patent Document 1 indicated below is known as a current sensor of this type. This current sensor is equipped with a ring-shaped coil, a printed circuit board on which a chip-type noise filter and chip resistors for dividing a voltage are mounted, a non-magnetic shield case which is made of aluminum or the like and internally houses the ring-shaped coil and the printed circuit board, and an external case that is non-magnetic and insulating and is made of resin or the like.

The printed circuit board has an input-side conductive pattern, a relaying conductive pattern, an output-side conductive pattern, and an earthed conductive pattern on one surface. The chip-type noise filter is a "T filter" composed of two inductors and one capacitor, the two ends of the series circuit composed of the inductors are respectively connected to the input-side conductive pattern and the relaying conductive pattern, and the two ends of the capacitor are respectively connected to the connection point between the inductors and the earthed conductive pattern. A 47Ω chip resistor (i.e., one resistor out of the voltage-dividing resistors) is mounted on the printed circuit board so as to connect the relaying conductive pattern and the output-side conductive pattern, and three chip resistors (i.e., the remaining resistors out of the voltage-dividing resistors) are mounted on the printed circuit board so as to connect the relaying conductive pattern and the earthed conductive pattern. These three chip resistors each have a resistance of 12Ω, and by connecting these three resistors in parallel, an overall resistance of 4Ω is produced.

A lead that extends from a detection winding of the ring-shaped coil is connected to the input-side conductive pattern and the other lead is connected to the earthed conductive pattern. The output-side conductive pattern is connected via a lead to the core wire at a first end of a coaxial cable and the earthed conductive pattern is connected to the earth wire at the first end of the coaxial cable.

With this configuration, by passing a wire to be detected through the ring-shaped coil of the current sensor so that the wire is used as the primary winding of a current transformer, a current that is proportional to the current on the detected wire will be induced in the detection winding of the ring-shaped coil that functions as the secondary winding of the transformer. After removal of high-frequency noise by the chip-type noise filter, the induced current is converted to a voltage by the three chip resistors that are connected in parallel so as to construct a 4Ω resistor. The converted voltage is also outputted to the core wire of the coaxial cable via the 47Ω chip resistor. With this configuration, the three chip resistors that construct a 4Ω resistor and the 47Ω chip resistor together function as an approximately 50Ω resistor, and it is believed that matching the impedance when looking from the input end of the coaxial cable used as a transmission path toward the noise filter to the input impedance of the coaxial cable (i.e., the characteristic impedance (50Ω) of the transmission path) will reduce disturbances occurring in the waveform of the signals transmitted through the coaxial cable.

CITATION LIST

Patent Literature

Patent Document 1
 Japanese Laid-open Patent Publication No. H07-260830 (Pages 3 and 4, and FIGS. 6 and 11)

SUMMARY OF INVENTION

Technical Problem

However, the current sensor described above has the following problem to be solved. The current sensor uses a configuration where the current induced in the detection winding (more specifically, the current outputted from the noise filter) is converted to a voltage by a resistor with a low resistance value of 4Ω (i.e., a resistance that is a large load for the detection winding). To prevent reflections, a measuring apparatus that measures high-frequency transmission characteristics is typically configured so that the other end of a coaxial cable is terminated by a terminating resistance with the same resistance value as the characteristic impedance of the coaxial cable. For this reason, a configuration is used where a signal is outputted to a measuring apparatus with its voltage having been divided by the 47Ω chip resistor described above of the current sensor and the terminating resistance of the measuring apparatus. Accordingly, this current sensor has a problem in that the amplitude (level) of the outputted signal is significantly attenuated due to these elements.

The present invention was conceived to solve the problem described above and has a principal object of providing a current sensor and a measuring apparatus capable of outputting a signal via a transmission path with little attenuation while eliminating high frequency noise.

Solution to Problem

To achieve the stated object, a current sensor according to claim 1 comprises a magnetic core through whose interior a measured object is inserted; a coil that is wound around the magnetic core, has one end connected to a reference potential-side, and outputs, from another end, a detection current with a current value in keeping with a current value of a measured current flowing in the measured object inserted through the magnetic core; a constant impedance filter whose input terminal is connected to the other end of the coil, limits a frequency range of the detection current inputted from the input terminal to a desired frequency range, and outputs the detection current from an output terminal; a transmission path that has a characteristic impedance decided in advance and is directly connected at one end to the output terminal of the constant impedance filter; and a terminating resistance that is connected between another end of the transmission path and the reference potential and converts the detection current flowing via the transmission path to a detection voltage, wherein an impedance of the constant impedance filter when looking from the input terminal toward the terminating resistance is set at a same value as the characteristic impedance.

Also, a measuring apparatus according to claim 2 comprises the current sensor according to claim 1; and a measurer that measures a current value of the detection current based on the detection voltage converted by the current sensor.

Advantageous Effects of Invention

With the current sensor according to claim 1 and the measuring apparatus according to claim 2, the input terminal of the constant impedance filter is connected to the other end of the coil, the output terminal of the filter is directly connected to one end of the transmission path, and the filter is set so that the impedance when looking from the input terminal toward the terminating resistance is the same value as the characteristic impedance of the transmission path.

When an LC filter (low pass filter) that does not attenuate the amplitude of the output signal is used as the noise filter, undesirable peaks occur in the vicinity of the cutoff frequency in the frequency characteristics of the LC filter due to resonance caused by the parasitic capacitance of the coil and by the inductors that construct the LC filter (peaks such as that depicted by the broken line in FIG. 4). However, according to the present current sensor and measuring apparatus, by using a constant impedance filter as the noise filter, since the impedance when looking from the input terminal of the constant impedance filter toward the terminating resistance appears as a resistance component, it is possible to suppress the occurrence of peaks like that described above due to the parasitic capacitance of the coil, and possible to transmit the detection current outputted from the coil via the transmission path to the terminating resistance with a substantially constant amplitude while reliably eliminating the noise components (i.e., high-frequency noise) included in the detection current at the filter and with hardly any attenuation in the frequency components (the base frequency components of the measured current) that compose the detection current, and to convert the detection current to the detection voltage at the terminating resistance. By doing so, according to the present current sensor and measuring apparatus, since it is possible to output the detection voltage to the measurer with a favorable S/N ratio, it is possible to measure the current value of the measured current at the measurer with high precision.

BRIEF DESCRIPTION OF DRAWINGS

FIG. 1 depicts both a current sensor 1 and a measuring apparatus MD that includes the current sensor 1.

FIG. 2 is a circuit diagram of a one-stage constant impedance filter.

DESCRIPTION OF EMBODIMENTS

Figure 3:
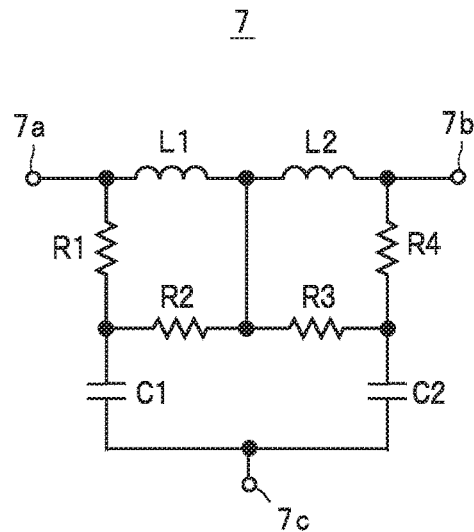
FIG. 3 is a circuit diagram of a two-stage constant impedance filter.

Embodiments of a current sensor 1 and a measuring apparatus MD will now be described with reference to the attached drawings.

First, the configuration of the current sensor 1 will be described with reference to FIG. 1.

As described in FIG. 1, as one example the current sensor 1 includes a magnetic core 2, a coil 5, a filter 7, and a current-to-voltage converter IVC, is configured as a CT (current transformer) type current sensor, and detects a measured current I1 flowing on a measured electrical path 21 as a measured object that has been passed through the magnetic core 2.

As one example, the magnetic core 2 is in the overall form of a ring shape, is split so as to be capable of opening and closing about a base end portion (the lower end portion in FIG. 1), and is configured so as to be capable of clamping the measured electrical path 21 that is a live wire (i.e., capable of having the measured electrical path 21 inserted through its interior). Note that the magnetic core 2 is not limited to being splittable, and it is possible to use a (non-splittable) configuration through which wires are passed.

The coil 5 is formed by winding a wire material around the magnetic core 2. One end $5a$ of the coil 5 is connected to a reference potential (the ground G). Although the end $5a$ of the coil 5 is directly connected to the reference potential as an example configuration in the present embodiment, it is also possible to use a configuration where the end $5a$ is connected to the reference potential via a resistor (a resistor with a low resistance of several tens of $\Omega$ or below) or a capacitor (a capacitor with an capacitance such that the impedance in the frequency range of the measured current I1 is several tens of $\Omega$ or below).

The filter 7 is constructed of a constant impedance filter as a low pass filter. An input terminal $7a$ of the filter 7 is directly connected to the other end $5b$ of the coil 5, an output terminal $7b$ is directly connected to one end $8a$ of a transmission path 8, described later, that constructs the current-to-voltage converter IVC, and a ground terminal $7c$ is directly connected to the ground G. As described later, when the coil 5 is functioning as a current transformer, the filter 7 causes attenuation so as to reduce the amplitude of frequency components at or above the cut off frequency, out of the frequency components of the current I2 (a current whose current value is "I1/N" when the number of turns in the coil 5 is set as N and the current value of the measured current I1 is expressed as "I1") outputted from the other end $5b$ of the coil 5 as the detection current, to $1/\sqrt{2}$ or below. That is, the filter 7 limits the frequency range of the current I2 to a desired frequency range (a frequency range below the cutoff frequency). Accordingly, the cutoff frequency of the filter 7 is set in advance at a frequency that is slightly higher than an upper limit frequency of the measured current I1 (that is, the upper limit frequency of the current I2) to be detected as the measured value. The filter 7 outputs the current I2 composed of frequency components below the cutoff frequency with hardly any attenuation in amplitude.

Also, the constants of the electronic components that construct the filter 7 that is constructed as mentioned above of a constant impedance filter are set in advance so that the impedance of the filter 7 when looking from the input terminal $7a$ toward a terminating resistance 9, described later, is the same value as the characteristic impedance of the transmission path 8 (the input impedance of the current-to-voltage converter IVC). As one example, when the characteristic impedance is $50\Omega$, the impedance of the filter 7 is the same $50\Omega$.

It is also possible to construct the filter 7 of a single-stage constant impedance filter, or by connecting a plurality of single-stage constant impedance filters in series, it is possible to construct a multi-stage constant impedance filter with steeper cutoff characteristics. As one example, the constant impedance filter depicted in FIG. 3 is a two-stage constant impedance filter constructed by connecting two single-stage constant impedance filters in series.

As one example in the present embodiment, the current-to-voltage converter IVC is equipped with the transmission path 8 and the terminating resistance 9. Here, the transmission path 8 has a characteristic impedance that is set in advance. One end 8a of the transmission path 8 is connected to the output terminal 7b of the filter 7. As one example in the present embodiment, the transmission path 8 is constructed of a coaxial cable whose shield, not illustrated, is connected to ground so that the characteristic impedance is set at 50Ω or 75Ω (in the present embodiment, 50Ω). Note that the transmission path 8 is not limited to a coaxial cable and it should be obvious that so long as the characteristic impedance is set at a certain value decided in advance, it is possible to construct the transmission path 8 of a variety of transmission paths, such as a twisted pair cable.

As one example in the present embodiment, the terminating resistance 9 is constructed of a resistor connected between the other end 8b of the transmission path 8 and the ground G or of the input resistor of a measuring instrument, such as an oscilloscope. With this configuration, the terminating resistance 9 converts the current (the current I2 described later) flowing in the coil 5 to a detection voltage V2 that is outputted.

Next, the configuration of a measuring apparatus MD equipped with the current sensor 1 will be described with reference to FIG. 1. The measuring apparatus MD is equipped with the current sensor 1, a measurer 10, and an outputter 11, and is configured so as to be capable of measuring the measured current I1 flowing on the measured electrical path 21 as a measured object that has been inserted through the magnetic core 2, based on the detection voltage V2 that has been converted by the current sensor 1.

As one example, the measurer 10 is equipped with an A/D converter and a CPU (neither is illustrated), the A/D converter converts the detection voltage V2 converted by the current sensor 1 to a digital value, and the CPU measures (calculates) the current value I1a of the measured current I1 based on this digital value. The measurer 10 also outputs the measured current value I1a to the outputter 11.

The outputter 11 is constructed of a display apparatus, such as an LCD, and displays the current value I1a outputted from the measurer 10 on a screen. Note that the outputter 11 is not limited to a display apparatus and can be constructed for example of an external interface circuit. In this case, it is possible for the measuring apparatus MD to output the current value I1a to another external apparatus connected to the external interface circuit via a transmission path (a wired transmission path or wireless transmission path) and/or to store the current value I1a in an external storage apparatus connected to the external interface circuit.

Next, the operation of the current sensor 1 and the operation of the measuring apparatus MD will be described with reference to the drawings.

First, in the current sensor 1, the coil 5 as the current transformer detects the measured current I1 flowing in the measured electrical path 21 and outputs a current I2 (a current with a current value I1/N when the number of turns in the coil 5 is N and the current value of the measured current I1 is expressed by the symbol "I1") to the filter 7 as a detection current whose amplitude (current value) changes in accordance with the amplitude (current value) of the measured current I1. The current I2 flows on a current path from the ground G, the end 5a of the coil 5, the coil 5 itself, the other end 5b of the coil 5, the filter 7, the transmission path 8, and the terminating resistance 9 before reaching the ground G.

Since the filter 7 is constructed of a constant impedance filter, the filter 7 outputs the frequency components that compose the current I2 (base frequency components that are below the cutoff frequency of the filter 7) to the transmission path 8 with hardly any attenuation in amplitude.

On the other hand, the filter 7 outputs noise components included in the current I2 (frequency components of the cutoff frequency of the filter 7 and higher) to the transmission path 8 with sufficient attenuation compared to the frequency components described above that compose the current I2. For the filter 7 constructed of a constant impedance filter, the impedance when looking from the input terminal 7a toward the terminating resistance 9 appears as a resistance component of 50Ω. When a configuration that includes a typical LC filter (low pass filter) in place of the constant impedance filter is used, resonance caused by the parasitic capacitance of the coil 5 and by the inductors that construct the LC filter produces undesirable peaks in the vicinity of the cutoff frequency in the frequency characteristics of the filter 7. Conversely, a filter 7 constructed of a constant impedance filter is capable of avoiding the occurrence of such peaks. By doing so, as mentioned above, the filter 7 constructed of the constant impedance filter is capable of outputting frequency components below the cutoff frequency fc of the filter 7 to the transmission path 8 with little attenuation and therefore a substantially constant amplitude, while reliably attenuating frequency components at or above the cutoff frequency fc.

In the measuring apparatus MD, the measurer 10 measures the current value I1a of the measured current I1 based on the detection voltage V2 outputted from the current sensor 1 in this way and outputs the current value I1a to the outputter 11. The outputter 11 displays the current value I1a on the screen.

In this way, with the current sensor 1 and the measuring apparatus MD, the input terminal 7a of the filter 7 constructed of a constant impedance filter is connected to the other end 5b of the coil 5, the output terminal 7b of the filter 7 is directly connected to one end 8a of the transmission path 8, and the filter 7 is constructed of a constant impedance filter, i.e., a constant impedance filter whose output impedance in a frequency range at and above the cutoff frequency is set as the same value (50Ω) as the characteristic impedance of the transmission path 8.

This means that according to the current sensor 1 and the measuring apparatus MD, by using a constant impedance filter as the filter 7, since the impedance of the filter 7 when looking from the input terminal 7a of the filter 7 toward the transmission path 8 appears as a resistance component, it is possible to prevent the occurrence of the peaks described above that can be caused by the parasitic capacitance of the coil 5. Accordingly, it is possible to transmit the current I2 outputted from the coil 5 via the transmission path 8 to the terminating resistance 9 with a substantially constant amplitude while reliably removing the noise components (i.e., high-frequency noise) included in the current I2 at the filter 7 and with hardly any attenuation in the frequency components (the current I2, that is, the base frequency components of the measured current I1) that compose the current I2, and to convert the current I2 to the detection voltage V2 at the terminating resistance 9. In this way, according to the current sensor 1 and the measuring apparatus MD, it is possible to output the detection voltage V2 to the measurer 10 with a favorable S/N ratio, which makes it possible to measure the current value I1a of the measured current I1 at the measurer 10 with high precision.

Figure 4:
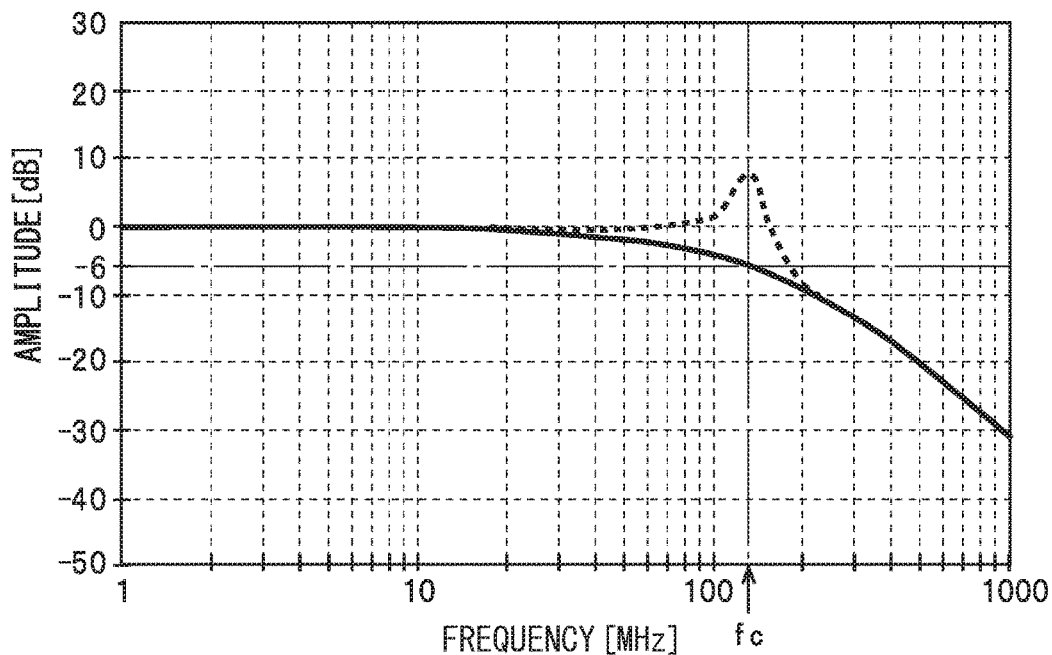
FIG. 4 is a frequency characteristics graph depicting the frequency characteristics for the amplitude of the detection voltage V2 when the one-stage constant impedance filter depicted in FIG. 2 is used as a filter 7.

Note that a frequency characteristics graph for the amplitude of the detection voltage V2 when the filter 7 is constructed of the single-stage constant impedance filter depicted in FIG. 2 was calculated by simulation and is depicted in FIG. 4. From this frequency characteristics graph, it can be confirmed that the current sensor 1 operates so that frequency components below the cutoff frequency fc that compose the current I2 are converted to the detection voltage V2 and outputted with hardly any attenuation, while frequency components at or above the cutoff frequency fc such as noise components (high-frequency noise) included in the current I2 are converted to the detection voltage V2 and outputted having been sufficiently attenuated.

Figure 5:
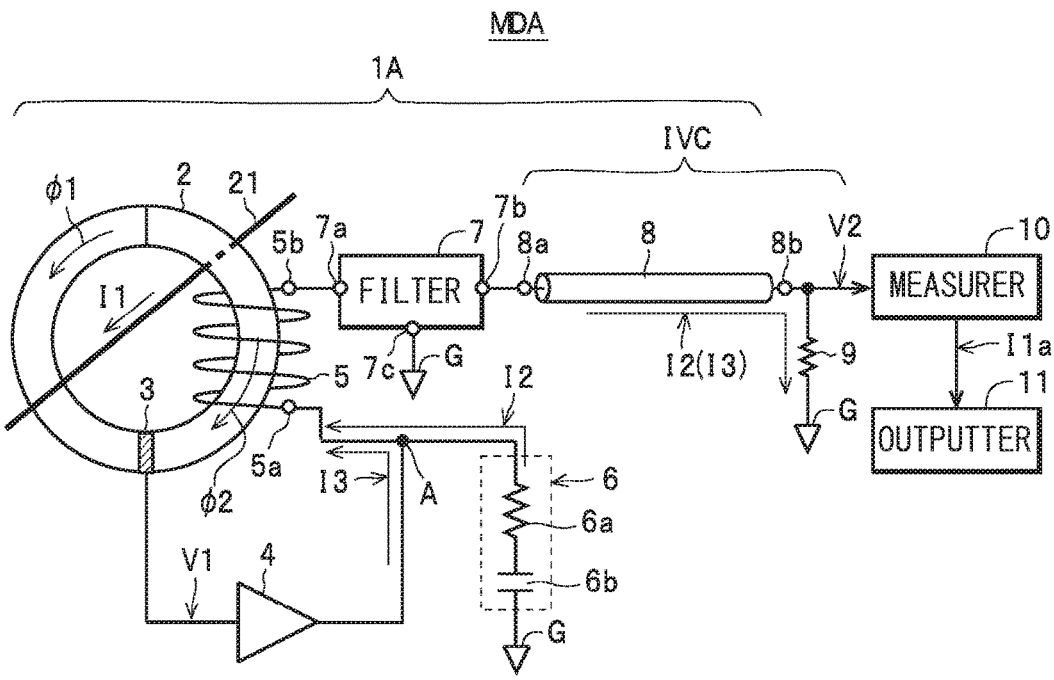
FIG. 5 depicts both a current sensor 1A and a measuring apparatus MDA that includes the current sensor 1A.

Although the current sensor 1 is constructed as a current transformer-type current sensor in the above description, as depicted in FIG. 5, by adding a magnetoelectric conversion outputter 3 such as a Hall element, a voltage-to-current converting amplifier 4, and a capacitive load 6 (in the present embodiment, a load constructed of a series circuit with a resistor 6a (of around 50Ω) and a capacitor 6b), it is also possible to construct a zero-flux (magnetic equilibrium) type current sensor 1A. Note that configurations that are the same as the measuring apparatus MD described above have been assigned the same reference numerals and duplicated description is omitted.

With the current sensor 1A of this configuration, in a low frequency range that starts at direct current, the magnetoelectric conversion outputter 3 and the voltage-to-current converting amplifier 4 mainly operate so that a current I3 (a current with a current value of I1/N when the number of turns in the coil 5 is N and the current value of the measured current I1 is expressed by the symbol "I1") that sets the magnetic flux in the magnetic core 2 at zero is supplied to the coil 5 and this current I3 is converted to the detection voltage V2 by the terminating resistance 9. Here, since the capacitive load 6 maintains a high impedance, the current I3 is prevented from leaking via the capacitive load 6 to the ground G. On the other hand, in a frequency range from an upper limit frequency of the low frequency range to the cutoff frequency of the filter 7, instead of the magnetoelectric conversion outputter 3 and the voltage-to-current converting amplifier 4 operating, the coil 5 operates as a current transformer as described above to output the current I2. Here, since the capacitive load 6 is kept at substantially the same value (a low resistance value) as the resistance value of the resistor 6a, the current I2 flows via the capacitive load 6. According to a measuring apparatus MDA that uses the current sensor 1A of this configuration, it is possible, while achieving the same effects as the measuring apparatus MD described above, to measure the frequency components included in the measured current I1 across a range from components at a low frequency close to direct current to high frequency components.

Figure 6:
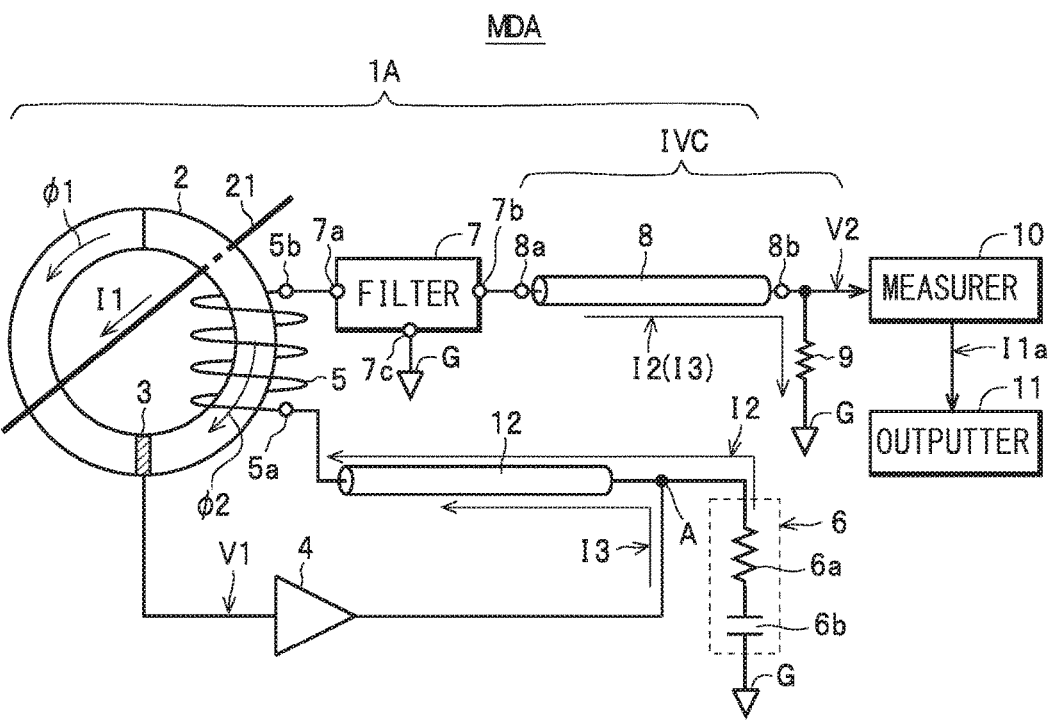
FIG. 6 depicts a different configuration of the measuring apparatus MDA in FIG. 5.

In the measuring apparatus MDA, in the same way as with the transmission path 8, the current I2 that includes signal components in the high-frequency range flows on a transmission path between the first end 5a of the coil 5 and the capacitive load 6. For this reason, as depicted in FIG. 6, the transmission path 12 between the first end 5a of the coil 5 and the capacitive load 6 can also be constructed of a coaxial cable (a coaxial cable whose shield, not illustrated, is connected to the ground G), a twisted pair cable, or the like whose characteristic impedance is a certain value decided in advance in the same way as the transmission path 8.

INDUSTRIAL APPLICABILITY

The present invention can be widely used in current sensors that include a constant impedance filter that limits the frequency range of a detection current, which is outputted from a coil wound around a magnetic core through which a measured object is inserted, to a desired frequency range and outputs the detection current from an output terminal to a transmission path, and in measuring apparatuses equipped with such a current sensor.

REFERENCE SIGNS LIST 1, 1A CURRENT SENSOR
2 MAGNETIC CORE
5 COIL
7 FILTER
8 TRANSMISSION PATH
9 TERMINATING RESISTANCE
10 MEASURER
I2 CURRENT (DETECTION CURRENT)
MD, MDA MEASURING APPARATUS
V2 DETECTION VOLTAGE

The invention claimed is:

1. A current sensor comprising:
a magnetic core through whose interior a measured object is inserted;
a coil that is wound around the magnetic core, has one end connected to a reference potential-side, and outputs, from another end, a detection current with a current value in keeping with a current value of a measured current flowing in the measured object inserted through the magnetic core;
a constant impedance filter that is used in a normal mode whose input terminal is connected to the other end of the coil, limits a frequency range of the detection current inputted from the input terminal to a desired frequency range, and outputs the detection current from an output terminal;
a transmission path that has a characteristic impedance decided in advance and is directly connected at one end to the output terminal of the constant impedance filter; and
a terminating resistance that is connected between another end of the transmission path and the reference potential and converts the detection current flowing via the transmission path to a detection voltage,
wherein an impedance of the constant impedance filter when looking from the input terminal toward the terminating resistance is set at a same value as the characteristic impedance.

2. A measuring apparatus comprising:
the current sensor according to claim 1; and
a measurer that measures a current value of the measured current based on the detection voltage converted by the current sensor.

* * * * *